United States Patent
Blankenship et al.

(10) Patent No.: US 7,027,531 B2
(45) Date of Patent: Apr. 11, 2006

(54) METHOD AND SYSTEM FOR INITIALIZING A TRAINING PERIOD IN A TURBO DECODING DEVICE

(75) Inventors: Thomas Keith Blankenship, Streamwood, IL (US); Brian Keith Classon, Palatine, IL (US); Vipul Anil Desai, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 721 days.

(21) Appl. No.: 09/975,404

(22) Filed: Oct. 11, 2001

(65) Prior Publication Data

US 2002/0118777 A1 Aug. 29, 2002

Related U.S. Application Data

(60) Provisional application No. 60/258,974, filed on Dec. 29, 2000.

(51) Int. Cl.
*H03M 13/03* (2006.01)
(52) U.S. Cl. .................. 375/341; 714/795; 714/796
(58) Field of Classification Search ............... 375/262, 375/265, 316, 340, 341; 714/755, 786, 792, 714/794, 795
See application file for complete search history.

(56) References Cited

U.S. PATENT DOCUMENTS

| | | | |
|---|---|---|---|
| 5,933,462 A | | 8/1999 | Viterbi et al. |
| 6,510,536 B1 * | | 1/2003 | Crozier et al. .............. 714/755 |
| 6,813,743 B1 * | | 11/2004 | Eidson ........................ 714/795 |
| 6,829,313 B1 * | | 12/2004 | Xu .............................. 375/341 |
| 6,856,657 B1 * | | 2/2005 | Classon et al. ............. 375/341 |
| 6,857,101 B1 * | | 2/2005 | Levy .......................... 714/796 |

OTHER PUBLICATIONS

Fathi Raouafi, Adodo Dingninou, Claude Berrou; "Saving Memory in Turbo-Decoders Using the Max-Log-MAP Algorithm"; The Institution of Electrical Engineers, printed and published by IEEE, Savory Place, London WC2R OBL, UK, 1999, pp. 14/1-14/4.

* cited by examiner

*Primary Examiner*—Kevin Kim

(57) ABSTRACT

A method for processing an information sequence with an iterative decoder is provided. The information sequence is divided into a current window and at least one additional window. The current window of the information sequence is selected. At least one metric value for a current recursion of the current window is computed based on metric values from the additional window of the information sequence, wherein the additional window is a past iteration. Systems and programs for processing an information sequence are also provided.

10 Claims, 4 Drawing Sheets

METHOD AND SYSTEM FOR INITIALIZING A TRAINING PERIOD IN A TURBO DECODING DEVICE

CROSS REFERENCE TO RELATED APPLICATIONS

This application claims the benefit of provisional U.S. Patent Application No. 60/258,974 filed Dec. 29, 2000, to inventors Blankenship et al., herein incorporated by reference in its entirety.

FIELD OF THE INVENTION

The present invention relates generally to the field of communication systems. In particular, the present invention provides a method of initializing training recursions for iterative decoding.

BACKGROUND OF THE INVENTION

In a communication system, channel coding schemes may typically be employed for error correction. For instance, turbo codes may be used for reliable communications over a wireless channel. A variety of methods may be employed to decode these channel coding schemes. For example, turbo codes are generally decoded using an iterative decoding technique.

Some iterative decoding techniques process results from an underlying algorithm. For instance, a maximum a posteriori (MAP) algorithm, a variant such as the max-log-MAP or log-MAP, or a similar type of algorithm is generally used to decode a constituent code within a turbo code. The MAP algorithm may be referred to as a decoder. The results from the MAP algorithm, such as output log-likelihood ratios (LLRs), can then be used or modified for further decoding iterations. The MAP algorithm uses forward and backward recursions to update probability metrics and subsequently decode the constituent code. However, the MAP algorithm requires memory proportional to the frame size. In some standards, the frame sizes may reach up to 20,728 bits. Because the memory requirements of the MAP algorithm are proportional to the frame size, the amount of memory necessary to implement the MAP algorithm is a serious concern. For example, for a frame size of 20,728 bits and an eight-state constituent code, 2.65 Mbits of memory is required.

To alleviate these memory requirements, windowing techniques are frequently employed. In conventional windowing techniques, a frame is divided into windows. The MAP algorithm is performed one window at a time and thus only requires an amount of memory proportional to the window size.

However, while memory requirements are reduced, these conventional windowing techniques may not produce results that are as reliable as those produced without windowing. The results are not as reliable because the initial conditions for the forward recursion at the beginning of the window or the backward recursion at the end of the window are unknown, and must be estimated through a training procedure. Training recursions are run forward from a time before the beginning of the window or backward from a time after the end of the window to obtain reliable metric values for the initial conditions at the beginning and end of the window. The training period is often set to 32 or more, which may provide acceptable performance degradation from the un-windowed MAP algorithm.

Because the training is required for each window and the training period is the same for each window, an increase in the complexity of the windowing technique results. In some instances, the training period is equal to the window size. This doubles the complexity of a forward or backward recursion.

Moreover, because the training period is fixed over all signal-to-noise ratios (SNRs) and over all iterations, the training cost remains the same for all decoding iterations, even if the complexity of the iteration differs from that of the previous or subsequent iteration.

It would be desirable therefore to provide a method of initialization that allows near-optimal performance and that reduces the complexity associated with training.

DETAILED DESCRIPTION OF THE PRESENTLY PREFERRED EMBODIMENTS

Figure 1:
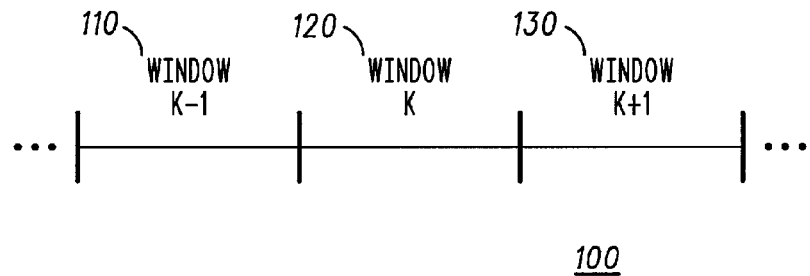
FIG. 1 is a schematic representation of an information burst decoded in accordance with the present invention.

FIG. 1 shows a schematic representation of an information burst that may be decoded in accordance with one embodiment of the present invention at 100. The term "burst" appearing herein may refer to a short or isolated transmission, a portion of a longer transmission, a portion of a continuous transmission, a portion of a semi-continuous transmission, a time-limited transmission, a bandwidth-limited transmission, or any combination thereof.

Information burst 100 may include coded or uncoded source information. Information burst 100 may comprise any suitable number of information symbols. Information burst 100 may be transmitted from any suitable transmitting device to any suitable receiving device. For example, information burst 100 may be transmitted from a base station to a wireless cellular device. Alternatively, a cellular device may transmit information burst 100 to a base station.

As seen in FIG. 1, information burst 100 may be processed with one embodiment of the present invention. In the embodiment of FIG. 1, information burst 100 has a size of N. Information burst 100 may be divided into two or more windows 110, 120, 130. These windows may be of differing length. Alternatively, as seen in FIG. 1, the windows 110, 120, 130 may have the same length.

Each window 110, 120, 130 of information burst 100 may be processed. For example, a window management function may control the processing of each window. In general, the windows may be processed in any order. In one embodiment, all windows are processed simultaneously in parallel. In another embodiment, the windows are processed from the front of information burst 100 to the back of the information burst 100 in sequential order. In yet another embodiment, the windows are processed from the back of information burst 100 to the front of information burst 100 in reverse sequential order.

Figure 2:
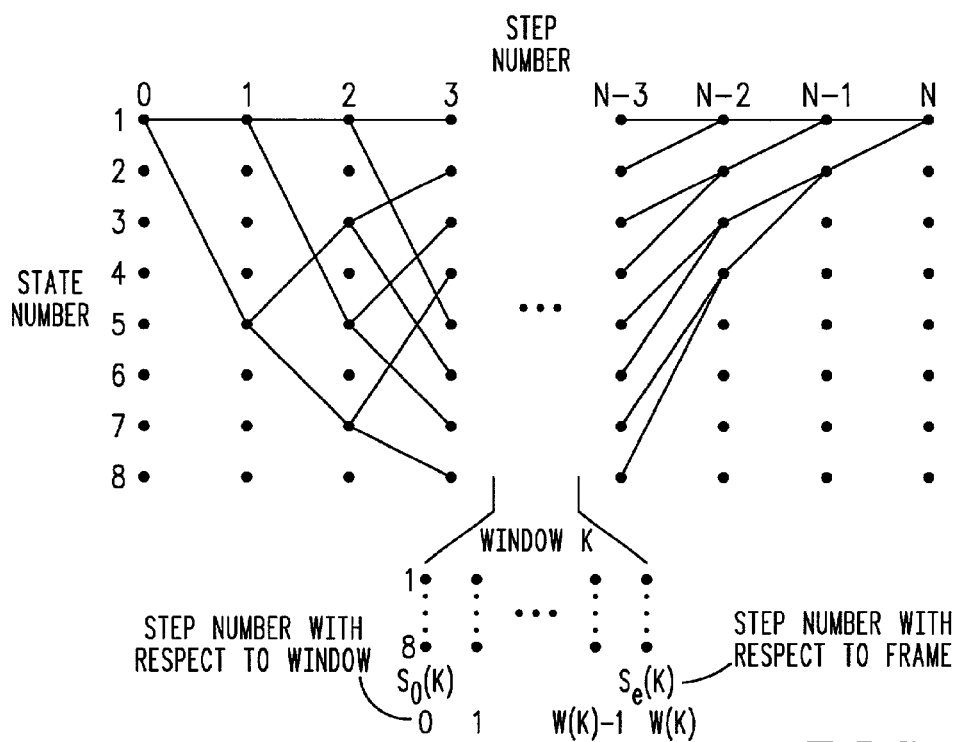
FIG. 2 is a schematic diagram of a frame-length-N trellis in accordance with the present invention.

FIG. 2 is a schematic diagram of a frame-length-N code trellis in accordance with the present invention. Such a diagram may be used, for example, by a decoder to denote the possible states through which the encoder may have passed. One possible decoder may be the MAP algorithm. Alternatively, similar variants of the MAP algorithm may be used. In the diagram of FIG. 2, there are eight possible states at each step. Alternatively, there may be more or less states for each step. To generate the output of the decoder (such as output LLRs from the MAP algorithm), a typical decoder may compute α probabilities for all states between steps 0 and N−1, inclusive. Alternatively, a typical decoder may compute β probabilities metrics for all states between steps 1 and N, inclusive. When windowing is used, the frame is generally divided into n windows, k=1, . . . ,n, which may have differing lengths. FIG. 2 calls out the k-th window in the frame. In the embodiment of FIG. 2, the symbols $s_0(k)$ and $s_e(k)$ are used to label the starting and ending steps, respectively, of the k-th window. These labels are referenced to the frame step numbers. From this definition, $s_0(1)$ may equal zero (0) and $s_e(n)$ may equal N, where N is the frame length. Furthermore, by definition $s_0(k+1)=s_e(k)$ and the size of the k-th window, $W(k)$, may be $W(k)=s_e(k)-s_0(k)$. In the following description, the symbol $\alpha_j(k)$, j=0, . . . ,W(k), may denote an ordered set of α's at step j of the k-th window. The elements of the set $\alpha_j(k)$ are referenced by $\alpha_j^l(k)$, where 1 runs from 1 to the cardinality of the set. Also in the following description, the symbol $\beta_j(k)$, j=0, . . . ,W(k), may denote an ordered set of β's at step j of the k-th window. The elements of the set $\beta_j(k)$ are referenced by $\beta_j^l(k)$, where l runs from 1 to the cardinality of the set. For example, in the embodiment of FIG. 2 the code has 8 states and the cardinality of the sets $\alpha_j(k)$ and $\beta_j(k)$ is 8.

Figure 3:
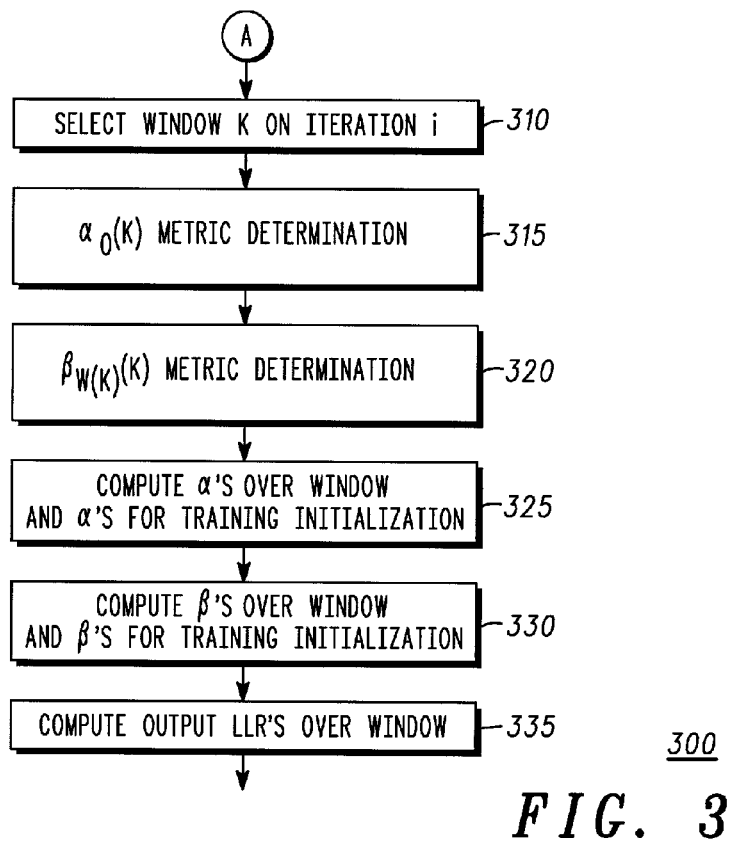
FIG. 3 is a flow diagram of one embodiment of a method for processing a window in an information burst in accordance with the present invention.

FIG. 3 shows a flow diagram of one embodiment of a method of processing a window in an information burst in accordance with the present invention at 300. A indicates a period before the processing of a window such as, for example, window k described above. During period A, a window adjacent to window k, such as, for example, window k−1 or window k+1 may be processed. Alternatively, during period A, an information burst 100 may be divided into windows as described above where window k is processed at the same time or before windows k−1 and k+1.

At block 310, a window is selected for processing. This window may be one of the windows 110, 120, 130 in information burst 100 or window k as described above. In one embodiment of the invention, the window may be processed using the algorithm shown below:

$$L_j = \ln\frac{P(u_j=+1|y)}{P(u_j=-1|y)} = \frac{\sum_{\substack{(s',s) \\ u_j=+1}} p(s',s,y)}{\sum_{\substack{(s',s) \\ u_j=-1}} p(s',s,y)} = \frac{\sum_{\substack{(s',s) \\ u_j=+1}} \alpha_{j-1}(s')\gamma_j(s',s)\beta_j(s)}{\sum_{\substack{(s',s) \\ u_j=-1}} \alpha_{j-1}(s')\gamma_j(s',s)\beta_j(s)}.$$

where the quantity p(s',s,y) may represent a joint probability that a branch of the trellis goes from state s' to state s during the j-th section of the code trellis and the entire received sequence y (e.g., information burst); $L_j$ may represent the output likelihood value at section j of the trellis, and $u_j$ may be the j-th information symbol. Because of the underlying Markov nature of the code, this probability may be broken up into a product of three probabilities: past $\alpha_{j-1}(s')=p(s',y_{m<j})$, present $\gamma_j(s',s)=p(s,y_j|s')$, and future $\beta_j(s)=p(y_{m>j}|s)$. The notation $y_{m<j}$ may represent the sequence of symbols whose position within the sequence is less than j. Similarly, the notation $Y_{m>j}$ may represent the sequence of symbols whose position within the sequence is greater than j. The α and β probabilities may be calculated through generalized forward and backward recursions, respectively, on the code trellis.

After selecting a window, metric determinations are made for the α probabilities (α's) for the beginning state $\alpha_0(k)$ and the β probabilities (β's) for the final state $\beta_{W(k)}(k)$ of the window as seen at blocks 315, 320. Depending upon how the windows are processed, this may be done by copying metrics from adjacent windows or by training.

In one embodiment of the invention, $\alpha_0(k)$ may be determined through training for windows k=2, . . . ,n for block 315. Meanwhile, $\beta_{W(k)}(k)$ may be determined through training for windows k=1, . . . ,n−1 for block 320. This embodiment may be used, for example, when the windows 110, 120, 130 are processed simultaneously in parallel.

In another embodiment of the invention, $\alpha_0(k)$ may be set to equal to $\alpha_{W(k-1)}(k-1)$ for windows k=2, . . . ,n for block 315. Meanwhile, $\beta_{W(k)}(k)$ may be determined through training for windows k=1, . . . ,n−1 for block 320. This embodiment may be used, for example, when windows 110, 120, 130 are processed sequentially from the front to the back of the information burst 100.

In another embodiment of the invention, $\alpha_0(k)$ may through training for windows k=2, . . . ,n at block 315. Meanwhile, $\beta_{W(k)}(k)$ may be set to equal $\beta_0(k+1)$ for windows k=1, . . . ,n−1 at block 320. This embodiment may be used, for example, when the windows 110, 120, 130 are processed reverse sequentially from the back to the front of information burst 100.

In one embodiment of the invention, determination may occur as shown in FIG. 3 (i.e., $\alpha_0(k)$ determination followed by $\beta_{W(k)}(k)$ determination). Alternatively, determination may occur at block 320 followed by determination at block 315 (i.e., $\beta_{W(k)}(k)$ determination followed by $\alpha_0(k)$ determination). In another embodiment of the invention, block 315 and block 320 may occur at the same time.

Each metric determination block 315, 320 may accept inputs. These inputs may be accepted, for example, from a window management function such as described above. For example, metric determination block 315, 320 may accept $F_\alpha$ and/or $F_\beta$. $F_\alpha$ is a flag that may equal 0 when $\alpha_0(k)$ is determined from the adjacent window and may equal 1 for determination through training. Alternatively, $F_\beta$ is a flag that may equal 0 when $\beta_{W(k)}(k)$ is determined from the adjacent window and may equal 1 for determination through training.

Metric determination block 315, 320 may also accept $\alpha_{init}(k,i)$ and/or $\beta_{init}(k,i)$. $\alpha_{init}(k,i)$ may be an ordered set of metrics that initializes the α training recursion for the k-th window on iteration i. Alternatively, $\beta_{init}(k,i)$ may be an ordered set of metrics that initializes the β training recursion for the k-th window on iteration i. Note that the elements of the set $\alpha_{init}(k,i)$ ($\beta_{init}(k,i)$) may be referenced by $\alpha^l_{init}(k,i)$ ($\beta^l_{init}(k,i)$), for example, where the index l runs from 1 to the cardinality of the set.

Metric determination block 315, 320 may also accept $T_\alpha(k)$ and/or $T_\beta(k)$. $T_\alpha(k)$ may be the α training period for the k-th window. $T_\beta(k)$ may be the β training period for the k-th window.

At block 325, the α's may be computed over the k-th window. During the α recursion over the k-th window, α metrics may be computed that may be used to initialize the α training recursions of windows k'>k on the following iteration. This use of the α metrics computed over a window on the i-th iteration to initialize the training recursions on the (i+1)-st iteration is in accordance with the present invention.

At block 330, the β's may be computed over the k-th window. During the β recursion over the k-th window, β metrics may be computed that may be used to initialize the β training recursions of windows k'<k on the following iteration. This use of the β metrics computed over a window on the i-th iteration to initialize the training recursions on the (i+1)-st iteration is in accordance with the present invention.

In the embodiment of FIG. 3, block 325 precedes block 330. Alternatively, in another embodiment of the invention, block 330 can precede block 325. In yet another embodiment of the invention, block 325 and block 330 may occur at the same time.

At block 335, the decoder output, such as LLRs, may be computed over the window. This may accomplished using any suitable method known in the art. Alternatively, the decoder output may be computed within block 330 when block 325 precedes block 330. In another embodiment, the decoder output may be computed within block 325 when block 330 precedes block 325.

The procedure for using stored metrics from a previous iteration to initialize a training period that determines the starting recursion state for the window during the current iteration (blocks 315 or 320), and storing metrics in a current iteration to initialize a training period in a future iteration (blocks 325 and 330) may be described quantitatively. One such embodiment is presented below.

Let the α and β training periods of the k-th window be $T_\alpha(k)$ and $T_\beta(k)$, respectively. In general, the $\alpha_j(k)$ from iteration i can determine the $\alpha_{init}(k',i+1)$ when the equation $$\sum_{m=1}^{k-1} W(m) + j = s_0(k') - T_\alpha(k') \qquad \text{Eq. (1)}$$

is satisfied, where k' may represent the index of a window. Similarly, the $\beta_j(k)$ from iteration i may determine the $\beta_{init}(k',i+1)$ when the equation $$\sum_{m=1}^{k-1} W(m) + j = s_e(k') + T_\beta(k') \qquad \text{Eq. (2)}$$

is satisfied. In one embodiment of the invention, since metrics on the i-th iteration may influence the initialization of the training recursions on the (i+1)-st iteration, the quantities $s_0(k')$, $s_e(k')$, $T_\alpha(k')$, and $T_\beta(k')$ are all measured on the (i+1)-st iteration.

In general, the $\alpha_{init}(k',i+1)$ ($\beta_{init}(k',i+1)$) may be functions of $\alpha_j(k)$ ($\beta_j($ Previously, the conventional windowing technique uses an equiprobable initialization $$\alpha_{init}^l(k,i) = \beta_{init}^l(k,i) = C, \; \forall l, k, i,$$

where C is an arbitrary constant that may be independent of $\alpha_j(k)$ ($\beta_j(k)$).

In one embodiment, one function is a direct assignment, or $$\alpha_{init}(k', i+1) = \alpha_j(k), \qquad \text{Eq. (3)}$$

for all combinations of j, k, and k' satisfying Eq. (1) and $$\beta_{init}(k', i+1) = \beta_j(k) \qquad \text{Eq. (4)}$$

for all combinations of j, k, and k' satisfying Eq. (2).

In another embodiment, $$\alpha_{init}^l(k', i+1) = \begin{cases} \Delta\alpha_{\min}, & l = \arg\max_{l'} \alpha_j^{l'}(k) \\ 0, & l \neq \arg\max_{l'} \alpha_j^{l'}(k), \end{cases} \qquad \text{Eq. (5)}$$

for all combinations of j, k, and k' satisfying Eq. (1) and $$\Delta\alpha_{\min} = \min_{q \neq l} |\alpha_j^l(k) - \alpha_j^q(k)|, \; l = \arg\max_{l'} \alpha_j^{l'}(k), \text{ and} \qquad \text{Eq. (6)}$$

$$\beta_{init}^l(k', i+1) = \begin{cases} \Delta\beta_{\min}, & l = \arg\max_{l'} \beta_j^{l'}(k) \\ 0, & l \neq \arg\max_{l'} \beta_j^{l'}(k), \end{cases}$$

for all combinations of j, k, and k' satisfying Eq. (2) and $$\Delta\beta_{\min} = \min_{q \neq l} |\beta_j^l(k) - \beta_j^q(k)|, \; l = \arg\max_{l'} \beta_j^{l'}(k),$$

where q runs from 1 to the cardinality of the set and l' runs from 1 to the cardinality of the set.

In yet another embodiment, one function may be used for initializing $\alpha_{init}(k',i+1)$ while another function initializes $\beta_{init}(k',i+1)$. In another embodiment, an initialization function that can be based on $\alpha_j(k)$ may be used. In another embodiment, an initialization function that can be based on $\beta_j(k)$ may be used.

One of the benefits of the present invention is that near-optimal performance may be obtained with smaller training periods than required by the conventional windowing technique. This invention may require a modest increase in memory. However, in comparison, this increase may be significantly less than the memory required by the MAP algorithm. Additionally, for some embodiments, there may be a small increase in complexity for computing $\alpha_{init}(k',i+1)$ and $\beta_{init}(k',i+1)$ in comparison to the equiprobable initialization. However, this increase is offset by the savings due to reducing the training period.

Figure 4:
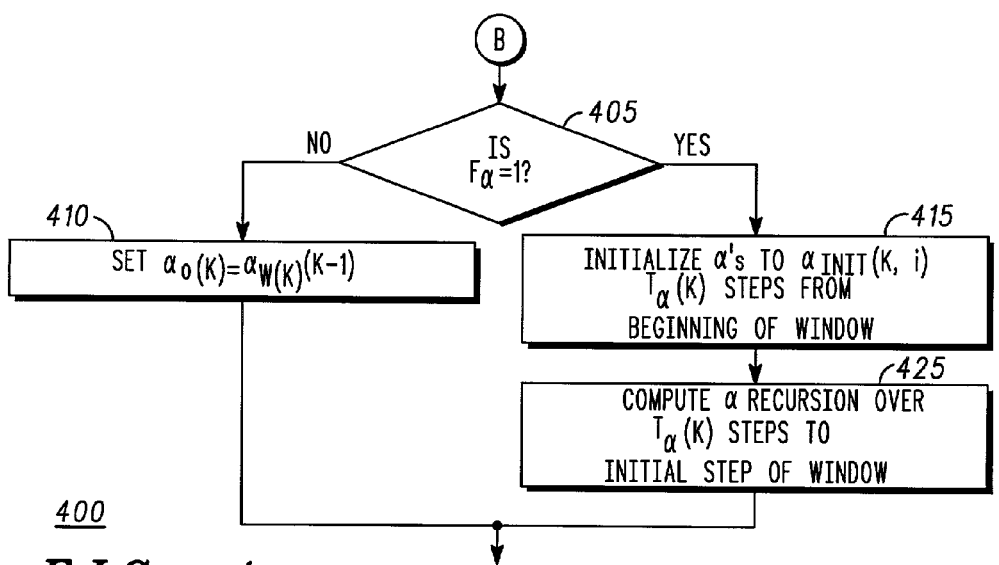
FIG. 4 is a flow diagram of one embodiment of a subroutine of the method shown in FIG. 3.

FIG. 4 shows a flow diagram of one embodiment of a subroutine in accordance with the present invention at 400. Routine 400 may be for example a subroutine corresponding to the metric determination block 315 for the k-th window described in FIG. 3. The subroutine of FIG. 4 may begin, for example, at B in FIG. 4.

At block 405, it may be determined whether $F_\alpha$ is equal to 1. If $F_\alpha \neq 1$, then the metric determination may occur by copying. In one embodiment, $\alpha_0(k)$ may be set to equal to $\alpha_{W(k-1)}(k-1)$ as seen at block 410.

If $F_\alpha=1$, then subroutine 400 (e.g., metric determination block 315) may also indicate that determination will occur by training. In one embodiment of the invention, the $\alpha$'s at step $s_0(k)$-$T_\alpha(k)$ are initialized to $\alpha_{init}(k,i)$ as seen at block 415. This may occur at a point $T_\alpha(k)$ steps from the beginning of the window. Then at block 425, an $\alpha$ recursion may be performed over the $T_\alpha(k)$ steps before the initial step of the window up to the initial step of the window.

Figure 5:
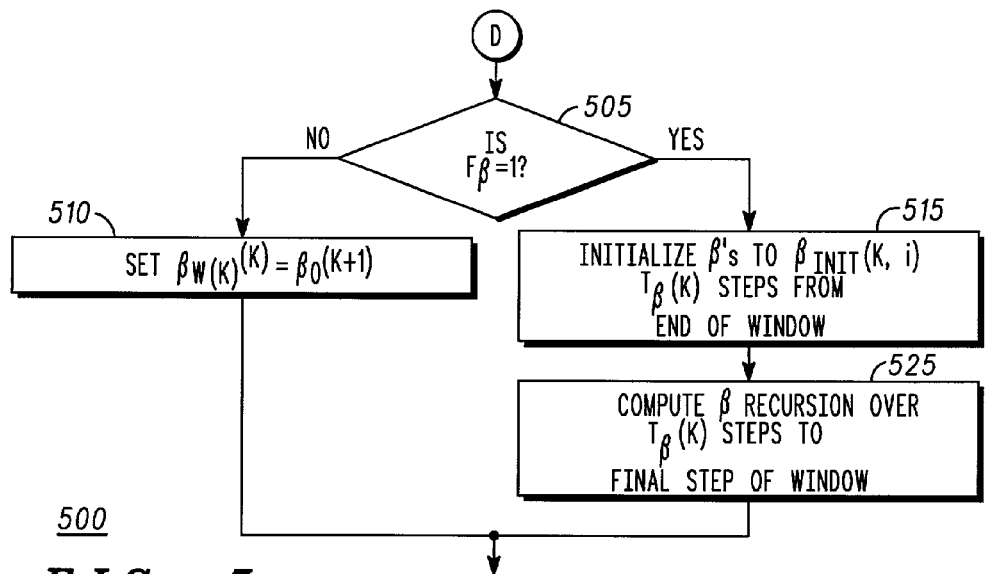
FIG. 5 is a flow diagram of another embodiment of a subroutine of the method shown in FIG. 3.

FIG. 5 shows a flow diagram of one embodiment of a subroutine in accordance with the present invention at 500. Routine 500 may be, for example, the metric determination block 320 for the k-th window described in FIG. 3. The subroutine of FIG. 5 may begin, for example, at D in FIG. 5.

At block 505, it may be determined whether $F_\beta$ is equal to 1. If $F_\beta \neq 1$, then the metric determination may occur by copying. In one embodiment, $\beta_{W(k)}(k)$ may be set to equal to $\beta_0(k+1)$ as seen at block 510.

If $F_\beta=1$, then subroutine 500 (e.g., metric determination block 320) may also indicate that determination will occur by training. In one embodiment of the invention, the $\beta$'s at step $s_e(k)+T_\beta(k)$ are initialized to $\beta_{init}(k,i)$ as seen at block 515. This may occur at a point $T_\beta(k)$ steps from the end of the window. Then at block 525, a $\beta$ recursion may be performed over the $T_\beta(k)$ steps after the final step of the window up to the final step of the window.

Figure 6:
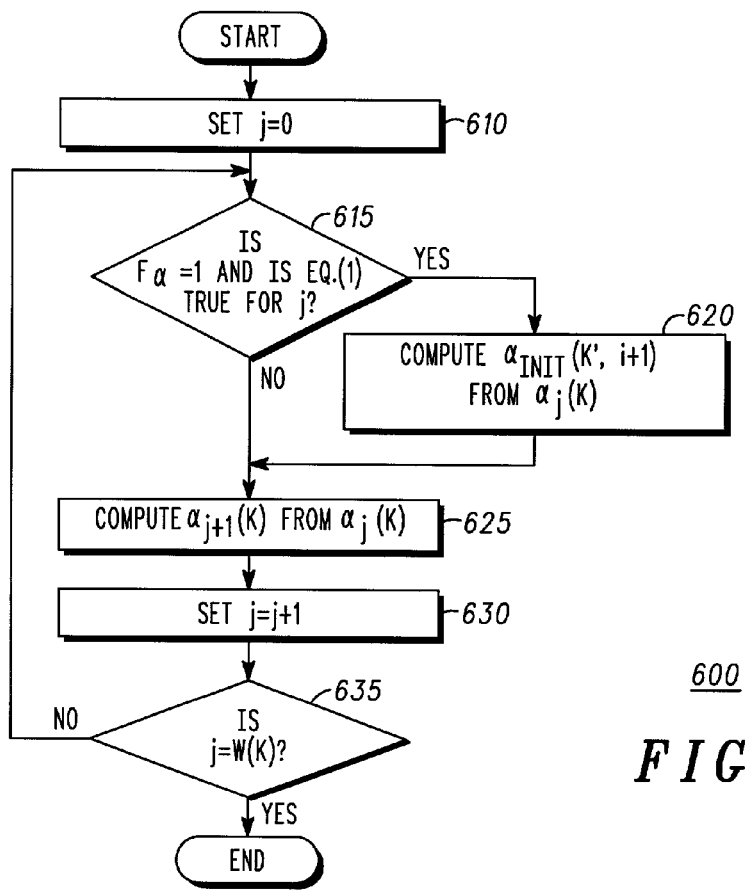
FIG. 6 is a flow diagram of one embodiment of the internal workings of an $\alpha$ recursion block for the k-th window in accordance with the present invention.

FIG. 6 shows a flow diagram of one embodiment of the internal workings of the $\alpha$ recursion block for the k-th window in accordance with the present invention at 600. In the embodiment shown in FIG. 6, the $\alpha_{j+1}(k)$ may be computed recursively from the $\alpha_j(k)$ for j=0,1,...,W(k)-1. However, if $\alpha_0(k)$ determination by training is specified (i.e., $F_\alpha=1$), then whenever Eq. (1) is satisfied, the $\alpha_j(k)$ may be used to compute initial values of $\alpha$ training recursions of windows k'>k for the following iteration.

Thus, at block 610, j may be set to 0 (i.e., j=0). Then at block 615, it may be determined whether $F_\alpha$ is equal to 1 and whether Eq. (1) is satisfied for j. If $F_\alpha=1$ and Eq. (1) is satisfied for j, then as seen at block 620, $\alpha_{init}(k',i+1)$ may be computed from $\alpha_j(k)$. In one embodiment, block 620 may implement Eq. (3) described above. In another embodiment, block 620 may implement Eq. (5) described above. In yet another embodiment, block 620 may implement a function for $\alpha_{init}(k',i+1)$ from $\alpha_j(k)$. Alternatively, $\alpha_{init}(k',i+1)$ may be computed using any suitable method known in the art.

At block 625, $\alpha_{j+1}(k)$ may be computed from $\alpha_j(k)$. This may be accomplished using any suitable method known in the art. The information computed at block 625 may be handled in any suitable manner known in the art. In one embodiment of 625, the results of block 625 may be stored. In another embodiment, the results of block 625 may be available for computing. For example, the results of block 625 may be used to compute LLRs.

At block 630, j may be set to j+1 (i.e., j=j+1). Then at block 635, it may be determined whether j=W(k). If j is equal to W(k), the routine may end. Otherwise, the routine may return to block 615.

Figure 7:
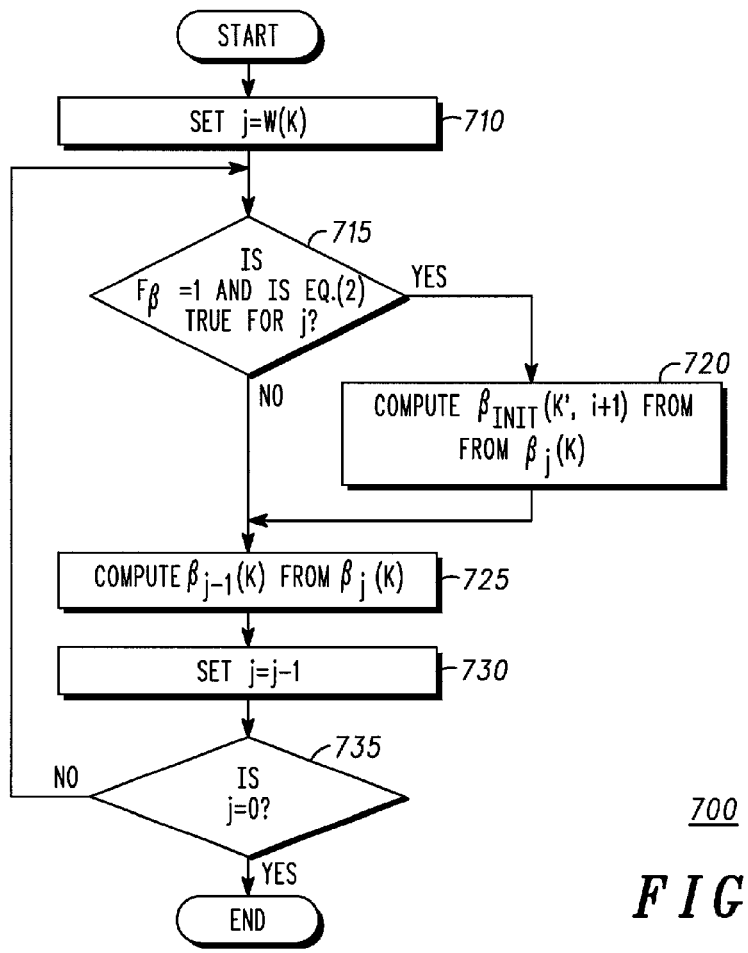
FIG. 7 is a flow diagram of one embodiment of the internal workings of a $\beta$ recursion block for the k-th window in accordance with the present invention.

FIG. 7, shows a flow diagram of one embodiment of the internal workings of the $\beta$ recursion block for the k-th window in accordance with the present invention at 700. In the embodiment of FIG. 7, the $\beta_{j-1}(k)$ are computed recursively from the $\beta_j(k)$ for j=W(k),W(k)-1,...,1. However, if $\beta_{W(k)}(k)$ determination by training is specified (i.e., $F_\beta=1$), then whenever Eq. (2) is satisfied, the $\beta_j(k)$ may be used to compute initial values of $\beta$ training recursions of windows k'<k for the following iteration.

Thus, at block 710, j may be set to W(k) (i.e., j=W(k)). Then at block 715, it may be determined whether $F_\beta$ is equal to 1 and whether Eq. (2) is satisfied for j.

If $F_\beta=1$ and Eq. (2) are satisfied for j, then as seen at block 720, $\beta_{init}(k',i+1)$ may be computed from $\beta_j(k)$. In one embodiment, block 720 may implement Eq. (4). In another embodiment, block 720 may implement Eq. (6). In yet another embodiment, block 720 can implement a function for $\beta_{init}(k',i+1)$ from $\beta_j(k)$. Alternatively, $\beta_{init}(k',i+1)$ may be computed using any suitable method known in the art.

At block 725, $\beta_{j-1}(k)$ may be computed from $\beta_j(k)$. This may be accomplished using any suitable method known in the art. The information computed at block 725 may be handled in any suitable manner known in the art. In one embodiment of 725, the results of block 725 may be stored. In another embodiment, the results of block 725 may be available for computing. For example, the results of block 725 may be used to compute LLRs.

Next, j may be set to j-1 (i.e., j=j-1) as seen at block 730. Then at block 735, it may be determined whether j=0. If j is equal to 0, the routine may end. Otherwise, the routine may return to block 715.

Figure 8:
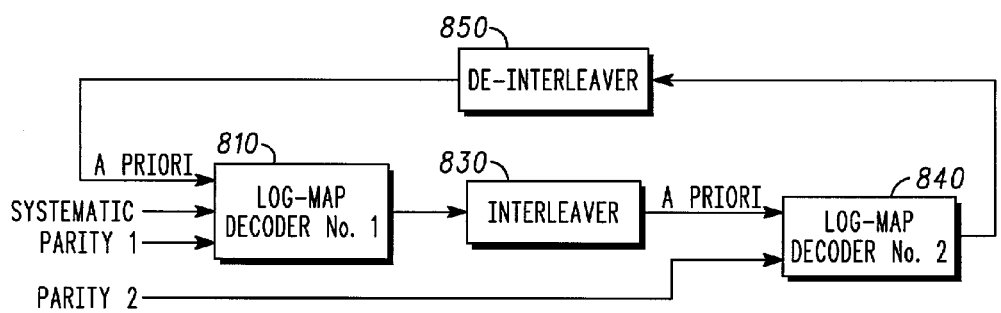
FIG. 8 shows a schematic representation of one embodiment of a turbo decoding system in accordance with the present invention.

FIG. 8 shows a schematic representation of a turbo decoding system in accordance with the present invention at 800. Turbo decoding system 800 may include at least one log-MAP decoder 810. In the embodiment of FIG. 8, turbo decoding system 800 also includes a second log-MAP decoder 840. Alternatively, MAP or MAP variants may be used instead of log-MAP decoders. Turbo decoding system 800 may also include an interleaver 830 and a de-interleaver 850.

While specific embodiments of the present invention have been shown and described, it will be apparent to those skilled in the art that the disclosed invention may be modified in numerous ways and may assume many embodiments other than those specifically set out and described above. Accordingly, the scope of the invention is indicated in the appended claims, and all changes that come within the meaning and range of equivalents are intended to be embraced therein.

The invention claimed is:

1. A method for processing an information sequence with an iterative decoder, comprising:
    dividing the information sequence into a current window and at least one additional window;
    selecting the current window of the information sequence;
    computing at least one metric value for a current recursion of the current window based on metric values from another window in a previous iteration, wherein the another window is from the at least one additional window; and
    initializing a training recursion for the current window based on the metric values.

2. The method of claim 1, further comprising:
    processing the metric values.

3. The method of claim 2, further comprising:
    storing the processed metric values.

4. The method of claim 2, wherein the processing step comprises:
    assigning the metric values.

5. The method of claim 1, further comprising:
    determining an index of the metric values.

6. An iterative decoding system, comprising:
    means for dividing an information sequence into a current window and at least one additional window;

means for selecting the current window of the information sequence; and means for computing at least one metric value for a current recursion of the current window in a current iteration based on metric values of another window that were recursively computed in a previous iteration.

7. The system of claim 6, further comprising:

means for processing the metric values to produce processed metric values.

8. The system of claim 7, further comprising:

means for storing the processed metric values.

9. The system of claim 7, further comprising:

means for assigning the metric values.

10. A turbo decoding system comprising:

at least one interleaver;

at least one de-interleaver;

at least one decoder, wherein the at least one decoder comprises:

means for dividing an information sequence into a current window and at least one additional window;

means for selecting the current window of the information sequence; and means for computing at least one metric value for a current recursion of the current window in a current iteration based on metric values of another window that were recursively computed in a previous iteration.

* * * * *